(12) United States Patent
Lee et al.

(10) Patent No.: US 8,432,026 B2
(45) Date of Patent: Apr. 30, 2013

(54) STACKABLE MULTI-CHIP PACKAGE SYSTEM

(75) Inventors: Koo Hong Lee, Seoul (KR); Jae Hak Yee, Singapore (SG)

(73) Assignee: Stats Chippac Ltd., Singapore (SG)

( * ) Notice: Subject to any disclaimer, the term of this patent is extended or adjusted under 35 U.S.C. 154(b) by 864 days.

(21) Appl. No.: 11/462,607

(22) Filed: Aug. 4, 2006

(65) Prior Publication Data
US 2008/0029868 A1    Feb. 7, 2008

(51) Int. Cl.
*H01L 23/02* (2006.01)

(52) U.S. Cl.
USPC ........... 257/685; 257/686; 257/690; 257/698; 257/700; 257/712

(58) Field of Classification Search .......... 257/685, 257/686, 687, 690, 692, 693, 698, 700, 701, 257/702, 712, 713, 720, 723, 730
See application file for complete search history.

(56) References Cited

U.S. PATENT DOCUMENTS

| | | | |
|---|---|---|---|
| 5,757,080 A | 5/1998 | Sota | |
| 5,870,289 A * | 2/1999 | Tokuda et al. | 361/779 |
| 6,020,629 A * | 2/2000 | Farnworth et al. | 257/686 |
| 6,239,367 B1 | 5/2001 | Hsuan et al. | |
| 6,476,474 B1 | 11/2002 | Hung | |
| 6,534,859 B1 * | 3/2003 | Shim et al. | 257/706 |
| 6,784,547 B2 | 8/2004 | Pepe et al. | |
| 6,849,949 B1 | 2/2005 | Lyu et al. | |
| 6,984,881 B2 | 1/2006 | Takiar | |
| 6,998,703 B2 | 2/2006 | Di Stefano | |
| 7,045,396 B2 | 5/2006 | Crowley et al. | |
| 2001/0015485 A1 * | 8/2001 | Song et al. | 257/679 |
| 2003/0209740 A1 * | 11/2003 | Miyamoto et al. | 257/286 |
| 2008/0029905 A1 | 2/2008 | Merilo et al. | |
| 2008/0030205 A1 | 2/2008 | Fujii et al. | |
| 2008/0079130 A1 | 4/2008 | Ha et al. | |

* cited by examiner

*Primary Examiner* — Zandra Smith
*Assistant Examiner* — Paul Patton
(74) *Attorney, Agent, or Firm* — Ishimaru & Associates LLP

(57) ABSTRACT

A stackable multi-chip package system is provided including forming a first external interconnect having a first through hole and a second external interconnect having a second through hole, forming a first package subassembly having the first external interconnect and a first integrated circuit die, forming a second package subassembly having the second external interconnect and a second integrated circuit die, mounting the second package subassembly over the first package subassembly, and molding the first package subassembly and the second package subassembly.

20 Claims, 9 Drawing Sheets

STACKABLE MULTI-CHIP PACKAGE SYSTEM

CROSS-REFERENCE TO RELATED APPLICATIONS

The present application contains subject matter related to concurrently filed U.S. patent application Ser. no. 11/462,588. The related application is assigned to STATS ChipPAC Ltd.

The present application also contains subject matter related to a concurrently filed U.S. patent application Ser. no. 11/462,568. The related application is assigned to STATS ChipPAC Ltd.

TECHNICAL FIELD

The present invention relates generally to integrated circuit packages and more particularly to stackable integrated circuit packages.

BACKGROUND ART

Across all sectors, industries, and geographies, demands continue for the electronic industry to provide products that are lighter, faster, smaller, multi-functional, more reliable, and more cost-effective. In order to meet these expanding requirements of so many and varied consumers, more electrical circuits need to be more highly integrated to provide the functions demanded. Across virtually all applications, there continues to be growing demand for reducing size, increasing performance, and improving features of integrated circuits.

The seemingly endless restrictions and requirements are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc. As the demand grows for smaller electronic products with more features, manufacturers are seeking ways to include more features as well as reduce the size of the integrated circuits. However, increasing the density of integration in integrated circuits may be expensive and have technical limitations. Though technology continues its growth to once unimagined extents, practical limits of individual integrated circuits do exist.

To meet these needs, three-dimensional type integrated circuit packaging techniques have been developed and used. Packaging technologies are increasingly using smaller form factors with more circuits in three-dimensional packages. In general, package stacks made by stacking packages and stacked chip packages made by stacking chips in a package have been used. Package stacks may be manufactured by stacking packages that have already passed the necessary tests for their functions. Therefore, the yields and reliability of these package stacks may be higher than those stacked chip packages manufactured by stacking chips without being tested. However, the package stacks may be thicker as compared with stacked chip packages, because of the thickness of each individual stacked package.

Stacked packages are also susceptible to warpage causing uneven or missing mounting features or electrical connections. Attempts to provide stacking features have met with difficulty to control manufacturing, incompatible or incongruous materials, as well as insufficient structural integrity. The stacking features must provide both structural and electrical integrity and uniformity in order to provide reliable, high yield and functioning systems. In addition to providing the necessary structural and electrical integrity, the packages must provide an easy mounting process. The easy mounting process requires high yield for finished devices as well as known and economical manufacturing and equipment.

Every new generation of integrated circuits with increased operating frequency, performance and the higher level of large scale integration have underscored the need for back-end semiconductor manufacturing to increase the heat management capability within an encapsulated package. It is well acknowledged that when a semiconductor device becomes denser in term of electrical power consumption per unit volume, heat generated is also increases correspondingly. More and more packages are now designed with an external heat sink or heat slug to enhance the ability of heat being dissipated to the package ambient environment. As the state of the art progresses, the ability to adequately dissipate heat is often a constraint on the rising complexity of package architecture design, smaller footprint, higher device operating speed and power consumption.

As more functions are packed into the integrated circuits and more integrated circuits into the package, more heat is generated degrading the performance, the reliability and the life time of the integrated circuits. As more circuitry is packed into the integrated circuits, the integrated circuit generates more radiated energy called electromagnetic interference (EMI). Unlike heat, EMI should not be dissipated to the environment but its energy should be absorbed by the system back to a ground plane.

Thus, a need still remains for a stackable multi-chip package system providing low cost manufacturing, improved reliability, increased thermal performance, EMI mitigation, and robust structural support for thin profile integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stackable multi-chip package system including forming a first external interconnect having a first through hole and a second external interconnect having a second through hole, forming a first package subassembly having the first external interconnect and a first integrated circuit die, forming a second package subassembly having the second external interconnect and a second integrated circuit die, mounting the second package subassembly over the first package subassembly, and molding the first package subassembly and the second package subassembly.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
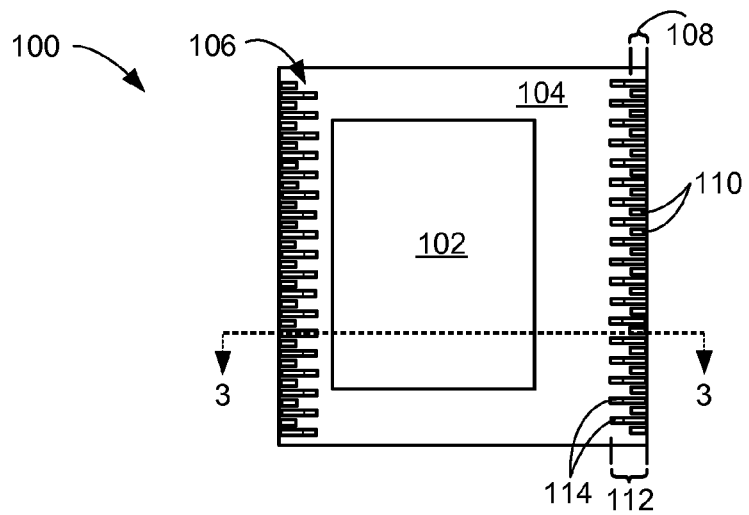
FIG. 1 is a top view of a stackable multi-chip package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a top view of a stackable multi-chip package system 100 in an embodiment of the present invention. The top view depicts a first non-active side 102 of an integrated circuit die surrounded an encapsulation 104, such as an epoxy mold compound. The first non-active side 102 may serve as a thermal dissipation path for the stackable multi-chip package system 100. The first non-active side 102 is shown offset from the center towards to the left edge, in this view, of the stackable multi-chip package system 100.

The stackable multi-chip package system 100 has dual land rows 106. The dual land rows 106 have a first row 108 of first lands 110, such as copper alloy, nickel/palladium, or gold alloy land sites, and a second row 112 of second lands 114, such as copper alloy, nickel/palladium, or gold alloy land sites. The first lands 110 and the second lands 114 may be made from any number of materials to provide a bondable surface. The second lands 114 extend more to the interior of the stackable multi-chip package system 100 than the first lands 110. The first row 108 and the second row 112 are staggered allowing connection to the first lands 110 without impeding connections to the second lands 114.

For illustrative purposes, the stackable multi-chip package system 100 is shown having the dual land rows 106, although it is understood that the number of rows may differ. Also for illustrative purposes, both top and bottom surfaces of the stackable multi-chip package system 100 are shown having first lands 110 and the second lands 114, although it is understood that the stackable multi-chip package system 100 may not have both land types or may not be on both the top and bottom surfaces. Further for illustrative purposes, the first non-active side 102 is exposed to ambient, although it is understood that the first non-active side 102 may not be exposed.

Figure 2:
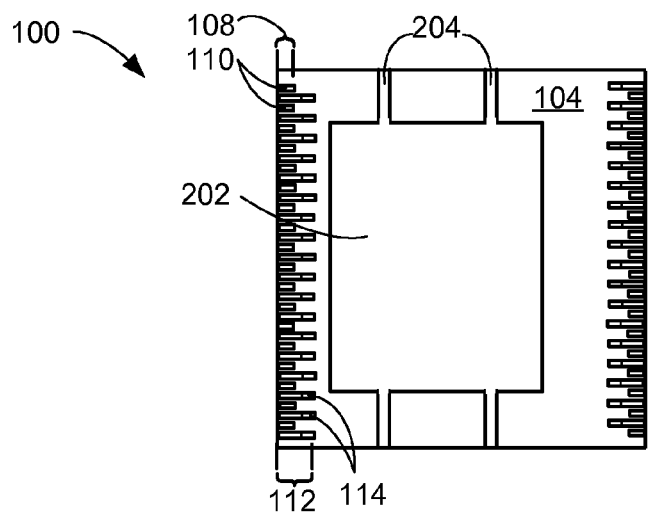
FIG. 2 is a bottom view of the stackable multi-chip package system of FIG. 1.

Referring now to FIG. 2, therein is shown a bottom view of the stackable multi-chip package system 100 of FIG. 1. The bottom view depicts a paddle 202, such as a die-attach paddle, a heat sink, an electromagnetic interference shield, or a planar rigidity structure for mitigating warpage, surrounded by the encapsulation 104. Paddle segments 204 extend from the paddle 202 to edges of the stackable multi-chip package system 100. The bottom view also depicts the first row 108 having the first lands 110 and the second row 112 having the second lands 114.

Figure 3:
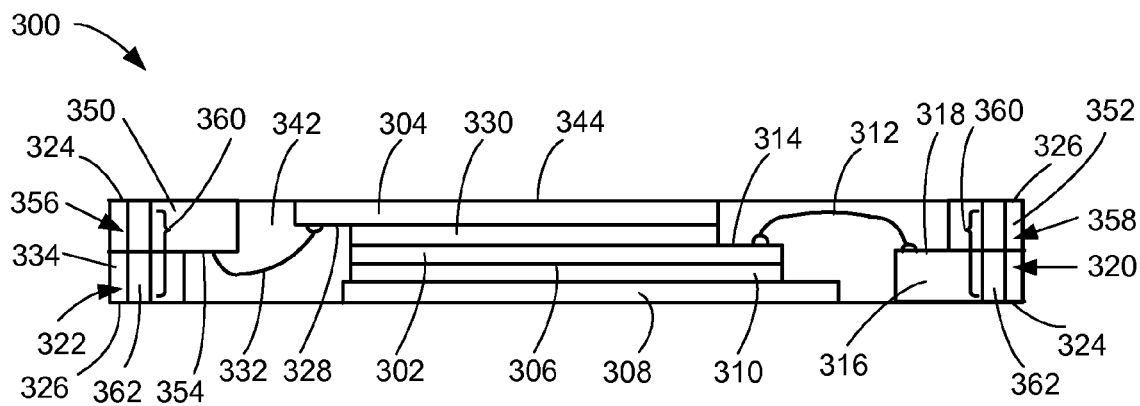
FIG. 3 is a cross-sectional view of a stackable multi-chip package system in an embodiment of the present invention.

Referring now to FIG. 3, therein is shown a cross-sectional view of a stackable multi-chip package system 300 in an embodiment of the present invention. This cross-sectional view may also represent the cross-sectional view of the stackable multi-chip package system 100 along the segment line 3-3 of FIG. 1. The stackable multi-chip package system 300 includes a stack of integrated circuit dice with a first integrated circuit die 302, such as a thin or ultra thin integrated circuit die, below a second integrated circuit die 304, such as a thin or ultra thin integrated circuit die. The second integrated circuit die 304 and the first integrated circuit die 302 may be substantially the same or the same type, such as functionality or technology, or may be different.

A first non-active side 306 of the first integrated circuit die 302 is attached to a paddle 308, such as die-attach paddle, with a first adhesive 310, such a die-attach adhesive. The first integrated circuit die 302 and the paddle 308 are between first external interconnects 316, such as leads, and second external interconnects 334, such as leads. The first external interconnects 316 provide first connection surfaces 318 and is wider than the second external interconnects 334. First internal interconnects 312, such as bond wires or ribbon bond wires, connect a first active side 314 of the first integrated circuit die 302 and the first connection surfaces 318.

Each of the first external interconnects 316 has a first through hole 320 from an upper surface to a lower surface. Sides of the first external interconnects 316 opposite the first connection surfaces 318 are part of second lands 324 of the second row 112 of FIG. 2. Each of the second external interconnects 334 has a second through hole 322 from its upper surface to its lower surface. Sides of the second external interconnects 334 in substantially the same plane as the second lands 324 are part of first lands 326 of the first row 108 of FIG. 1.

A second active side 328 of the second integrated circuit die 304 is attached to the first active side 314 with an interchip structure 330, such as a die-attach adhesive or a spacer. The second integrated circuit die 304 is offset from the first integrated circuit die 302 such that the second integrated circuit die 304 does not perturb the connections of the first internal interconnects 312 and the first integrated circuit die 302. The inter-chip structure 330 is directly on and solely between the first active side 314 and the second active side 328.

The second integrated circuit die 304 is between third external interconnects 350, such as leads, and fourth external interconnects 352, such as leads. Second internal interconnects 332, such as bond wires or ribbon bond wires, connect the second active side 328 and second connection surfaces 354 of the third external interconnects 350.

The third external interconnects 350 and the fourth external interconnects 352 are substantially the same as the first external interconnects 316 and the second external interconnects 334, respectively. Each of the third external interconnects 350 and the fourth external interconnects 352 have a third through hole 356 and a fourth through hole 358, respectively. Sides of the third external interconnects 350 opposite the second connection surfaces 354 are part of the second lands 324 of the second row 112 of FIG. 1. Sides of the fourth external interconnects 352 in substantially the same plane as the second lands 324 are part of the first lands 326 of the first row 108 of FIG. 2.

The third external interconnects 350 are over the second external interconnects 334. The fourth external interconnects 352 are over the first external interconnects 316. A channel 360 is formed with the first through hole 320 aligned with the fourth through hole 358 as well as with the second through hole 322 aligned with the third through hole 356. A channel plug 362, such as a plug of conductive material or solder paste, fills the channel 360.

The fourth external interconnects 352 over the first external interconnects 316 forms an L-shape configuration. The third external interconnects 350 over the second external interconnects 334 forms a similar L-shape configuration that is 180 degrees vertically flipped or referred to as inverted.

An encapsulation 342, such as an epoxy mold compound, covers the first integrated circuit die 302, the second internal interconnects 332, and the first internal interconnects 312. The encapsulation 342 partially covers the first external interconnects 316, the second external interconnects 334, the third external interconnects 350, and the fourth external interconnects 352 with the first lands 326 and the second lands 324 exposed.

A side of the paddle 308 opposite the first integrated circuit die 302 is exposed to ambient. The paddle 308 may serve other functions, such as a heat sink, an electromagnetic interference (EMI) shield, or a planar rigidity structure for mitigating warpage. A second non-active side 344 of the second integrated circuit die 304 is also exposed to ambient.

The staggered configuration of the first row 108 of FIG. 1 and of FIG. 2 and the second row 112 of FIG. 1 and of FIG. 2 are the first external interconnects 316 at alternating locations with the second external interconnects 334 and the third external interconnects 350 at alternating locations with the fourth external interconnects 352 forming mold interlock features. The mold interlock features improves performance in moisture level sensitivity (MSL) tests as well as increase structural rigidity.

The stackable multi-chip package system 300 may be tested to verify known good devices (KGD) of the second integrated circuit die 304 and the first integrated circuit die 302. The stackable multi-chip package system 300 may be a thin package, especially with thin or ultra-thin dice, having a package height of 0.20 mm.

Figure 4:
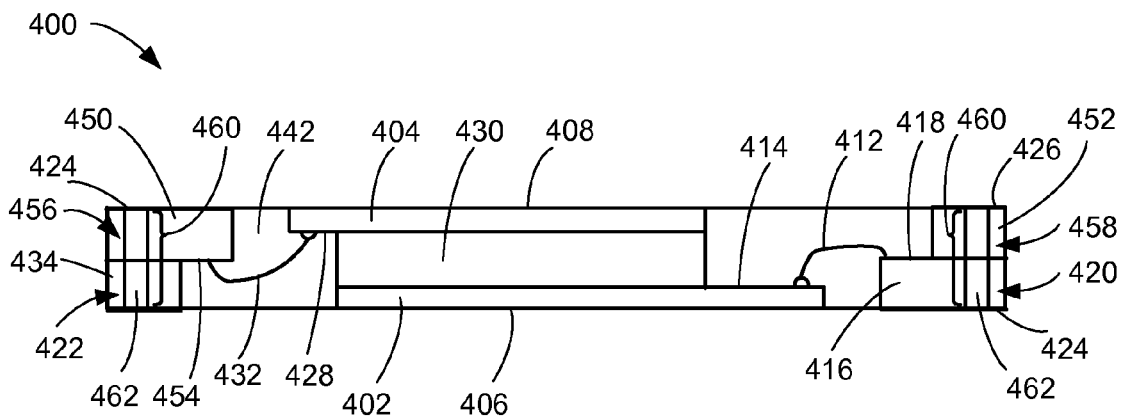
FIG. 4 is a cross-sectional view of a stackable multi-chip package system in an alternative embodiment of the present invention.

Referring now to FIG. 4, therein is shown a cross-sectional view of a stackable multi-chip package system 400 in an alternative embodiment of the present invention. This cross-sectional view may also represent the cross-sectional view of the stackable multi-chip package system 100 along the segment line 3-3 of FIG. 1. The stackable multi-chip package system 400 includes a stack of integrated circuit dice with a first integrated circuit die 402, such as a thin or ultra thin integrated circuit die, below a second integrated circuit die 404, such as a thin or ultra thin integrated circuit die. The second integrated circuit die 404 and the first integrated circuit die 402 may be substantially the same or the same type, such as functionality or technology, or may be different.

A first non-active side 406 of the first integrated circuit die 402 and a second non-active side 408 of the second integrated circuit die 404 are exposed to ambient and may be used as a thermal dissipation surfaces. The first integrated circuit die 402 is between first external interconnects 416, such as leads, and second external interconnects 434, such as leads. The first external interconnects 416 provide first connection surfaces 418 and is wider than the second external interconnects 434. First internal interconnects 412, such as bond wires or ribbon bond wires, connect a first active side 414 of the first integrated circuit die 402 and the first connection surfaces 418.

Each of the first external interconnects 416 has a first through hole 420 from an upper surface to a lower surface. Sides of the first external interconnects 416 opposite the first connection surfaces 418 are part of second lands 424 of the second row 112 of FIG. 2. Each of the second external interconnects 434 has a second through hole 422 from its upper surface to its lower surface. Sides of the second external interconnects 434 in substantially the same plane as the second lands 424 are part of first lands 426 of the first row 108 of FIG. 1.

A second active side 428 of the second integrated circuit die 404 is attached to the first active side 414 with an interchip structure 430, such as a die-attach adhesive or a spacer. The second integrated circuit die 404 is offset from the first integrated circuit die 402 such that the second integrated circuit die 404 does not perturb the connections of the first internal interconnects 412 and the first integrated circuit die 402.

The second integrated circuit die 404 is between third external interconnects 450, such as leads, and fourth external interconnects 452, such as leads. Second internal interconnects 432, such as bond wires or ribbon bond wires, connect the second active side 428 and second connection surfaces 454 of the third external interconnects 450.

The third external interconnects 450 and the fourth external interconnects 452 are substantially the same as the first external interconnects 416 and the second external interconnects 434, respectively. Each of the third external interconnects 450 and the fourth external interconnects 452 have a third through hole 456 and a fourth through hole 458, respectively. Sides of the third external interconnects 450 opposite the second connection surfaces 454 are part of the second lands 424 of the second row 112 of FIG. 1. Sides of the fourth external interconnects 452 in substantially the same plane as the second lands 424 are part of the first lands 426 of the first row 108 of FIG. 2.

The third external interconnects 450 are over the second external interconnects 434. The fourth external interconnects 452 are over the first external interconnects 416. A channel 460 is formed with the first through hole 420 aligned with the fourth through hole 458 as well as with the second through hole 422 aligned with the third through hole 456. A channel plug 462, such as a plug of conductive material or solder paste, fills the channel 460.

The fourth external interconnects 452 over the first external interconnects 416 forms an L-shape configuration. The third external interconnects 450 over the second external interconnects 434 forms a similar L-shape configuration that is 180 degrees vertically flipped or referred to as inverted.

An encapsulation 442, such as an epoxy mold compound, covers the second internal interconnects 432 and the first internal interconnects 412. The encapsulation 442 partially covers the first integrated circuit die 402, the second integrated circuit die 404, the first external interconnects 416, the second external interconnects 434, the third external interconnects 450, and the fourth external interconnects 452. The first non-active side 406, the second non-active side 408, the first lands 426 and the second lands 424 are exposed. The first integrated circuit die 402, the second integrated circuit die 404, the encapsulation 442, and the inter-chip structure 430 functions collaboratively as a structure for planar rigidity.

The staggered configuration of the first row 108 of FIG. 1 and of FIG. 2 and the second row 112 of FIG. 1 and of FIG. 2 are the first external interconnects 416 at alternating locations with the second external interconnects 434 and the third external interconnects 450 at alternating locations with the fourth external interconnects 452 forming mold interlock features. The mold interlock features improves performance in moisture level sensitivity (MSL) tests as well as increase structural rigidity.

The stackable multi-chip package system 400 may tested to verify known good devices (KGD) of the second integrated circuit die 404 and the first integrated circuit die 402. The stackable multi-chip package system 400 may be a thin package, especially with thin or ultra-thin dice, having a package height of 0.20 mm.

Figure 5:
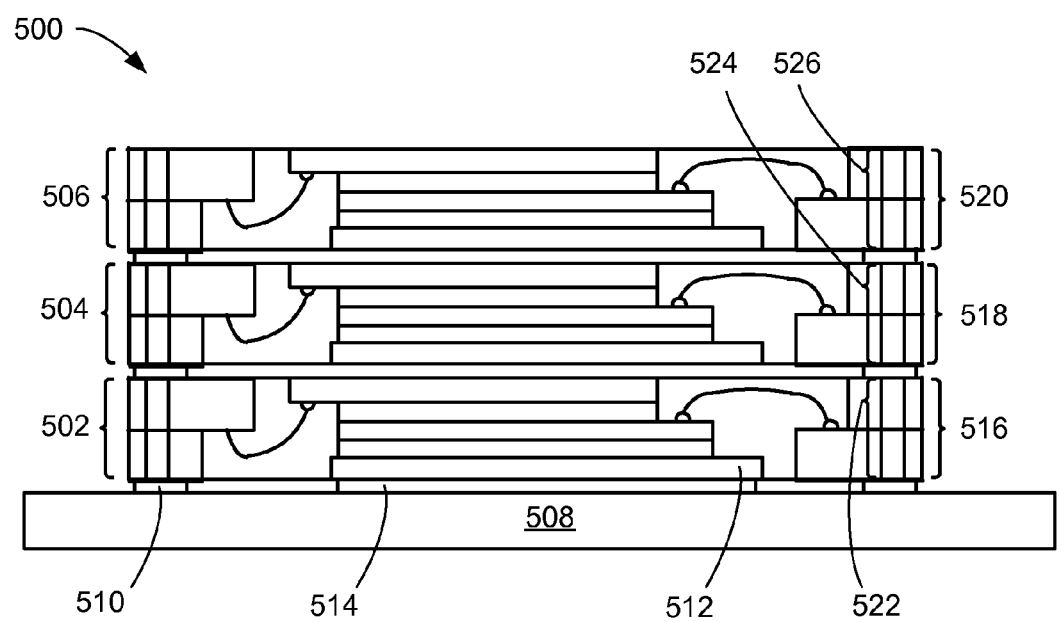
FIG. 5 is a cross-sectional view of an integrated circuit package-on-package system with the stackable multi-chip package system in another alternative embodiment of the present invention.

Referring now to FIG. 5, therein is shown a cross-sectional view of an integrated circuit package-on-package system 500 with the stackable multi-chip package system 300 in another alternative embodiment of the present invention. The integrated circuit package-on-package system 500 has a first package 502 stacked below a second package 504 with the second package 504 below a third package 506. The first package 502, the second package 504, and the third package 506 may be of similar or substantially the same as the stackable multi-chip package system 300 of FIG. 3.

The first package 502 is attached on a substrate 508, such as a printed circuit board, with a conductive material 510, such as a solder paste. A paddle 512 of the first package 502 is attached to the substrate 508 with an adhesive 514, such as a thermal adhesive or film adhesive. The substrate 508 may serve various functions, such as a system level heat sink or a ground source, for the paddle 512. First package external interconnects 516 are connected to the substrate 508 with the conductive material 510.

The second package 504 stacks on the first package 502 with second package external interconnects 518 connected to tops of the first package external interconnects 516 with the conductive material 510. Similarly, the third package 506 stacks on the second package 504 with third package external interconnects 520 connected to tops of the second package external interconnects 518 with the conductive material 510. The conductive material 510 connects a first channel 522 of the first package 502 with a second channel 524 of the second package as well as the second channel 524 with a third channel 526 of the third package 506.

The first package 502, the second package 504, and the third package 506 may be tested to ensure KGD before the package-on-package assembly process. This ensures any bad device is sorted out such that the yield for the integrated circuit package-on-package system 500 is not impacted by bad device. The integrated circuit package-on-package system 500 may further undergo testing during and after assembly.

Figure 6:
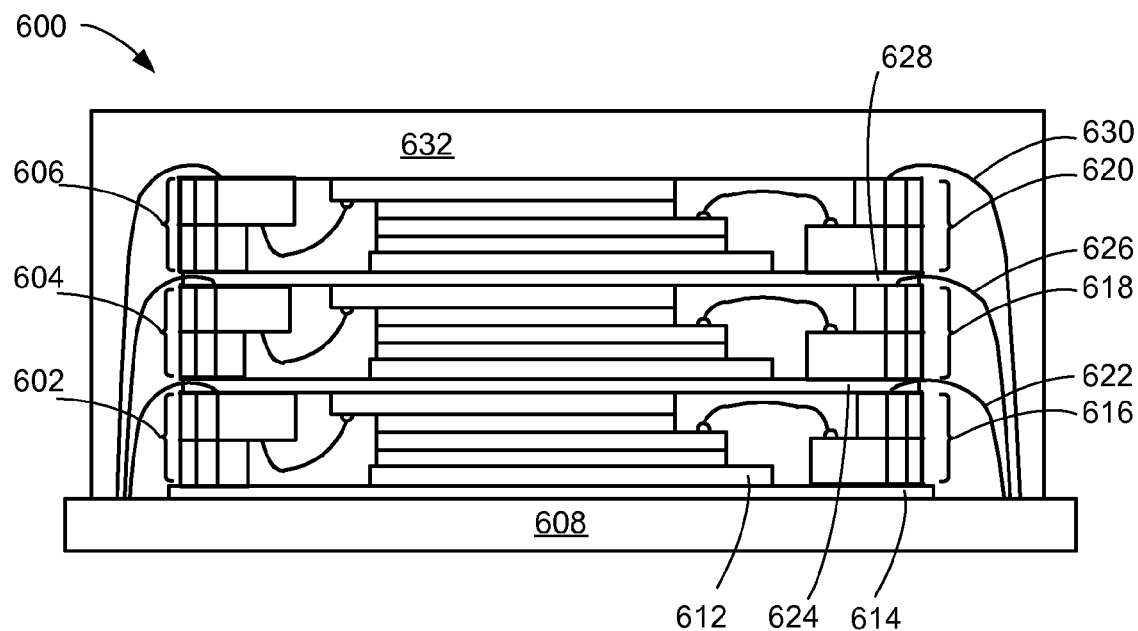
FIG. 6 is cross-sectional view of an integrated circuit package-in-package system with the stackable multi-chip package system in yet another alternative embodiment of the present invention.

Referring now to FIG. 6 is cross-sectional view of an integrated circuit package-in-package system 600 with the stackable multi-chip package system 300 in another alternative embodiment of the present invention. The integrated circuit package-in-package system 600 as a first package 602 stacked below a second package 604 with the second package 604 below a third package 606. The first package 602, the second package 604, and the third package 606 may be of similar or substantially the same as the stackable multi-chip package system 300 of FIG. 3.

The first package 602 is attached on a substrate 608, such as a printed circuit board, with an adhesive 614, such as a thermal adhesive. The substrate 608 may serve various functions, such as a system level heat sink or a ground source, for a paddle 612. First package external interconnects 616 of the first package 602 are connected to the substrate 608 with first interconnects 622, such as bond wires.

The second package 604 stacks over the first package 602 with a first intra-stack structure 624, such as a film adhesive, in between. Second package external interconnects 618 of the second package 604 are connected to the substrate 608 with second interconnects 626, such as bond wires.

Similarly, the third package 606 stacks over the second package 604 with a second intra-stack structure 628, such as a film adhesive, in between. Third package external interconnects 620 of the third package 606 are connected to the substrate 608 with third interconnects 630, such as bond wires.

A package encapsulation 632 covers the first package 602, the second package 604, the third package 606, the first interconnects 622, the second interconnects 626, and the third interconnects 630. The package encapsulation 632 may be any number of materials, such as an epoxy molding compound.

The first package 602, the second package 604, and the third package 606 may be tested to ensure KGD before the package-in-package assembly process. This ensures any bad device is sorted out such that the yield for the integrated circuit package-in-package system 600 is not impacted by bad devices. The integrated circuit package-in-package system 600 may further undergo testing during and after assembly.

Figure 7:
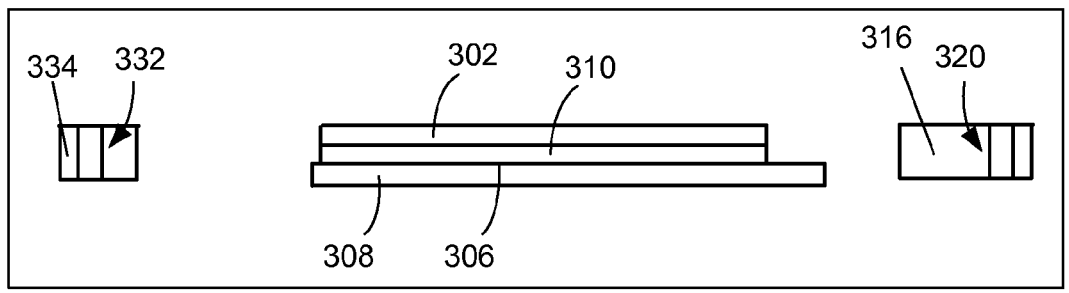
FIG. 7 is a cross-sectional view of the stackable multi-chip package system of FIG. 3 in a first die-attach phase.

Referring now to FIG. 7, therein is shown a cross-sectional view of the stackable multi-chip package system 300 of FIG. 3 in a first die-attach phase. The paddle 308, the first external interconnects 316, and the second external interconnects 334 are formed from a lead frame (not shown) by any number of processes, such as deep etch or stamp. The lead frame has a plurality of the set of the paddle 308, the first external interconnects 316 and the second external interconnects 334. The first through hole 320 and the second through hole 322 are also shown. The first non-active side 306 of the first integrated circuit die 302 is attached on the paddle 308 with the first adhesive 310. The first integrated circuit die 302 and the paddle 308 are between the first external interconnects 316 and the second external interconnects 334. The paddle segments 204 of FIG. 2 hold the paddle 308 in the lead frame.

Figure 8:
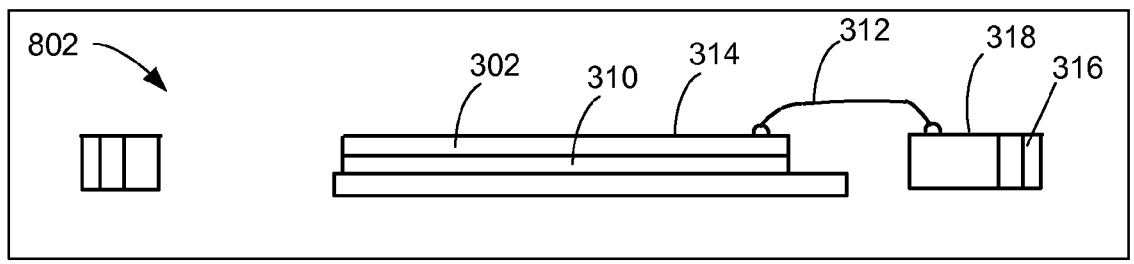
FIG. 8 is a cross-sectional view of the structure of FIG. 7 in a first interconnect-attach phase.

Referring now to FIG. 8, therein is shown a cross-sectional view of the structure of FIG. 7 in a first interconnect-attach phase. The first internal interconnects 312 connect the first active side 314 of the first integrated circuit die 302 and the first connection surfaces 318. This forms first package subassemblies 802 in the lead frame (not shown), wherein each of the first package subassemblies 802 has the first integrated circuit die 302 attached to the first external interconnects 316 with the first internal interconnects 312.

Figure 9:
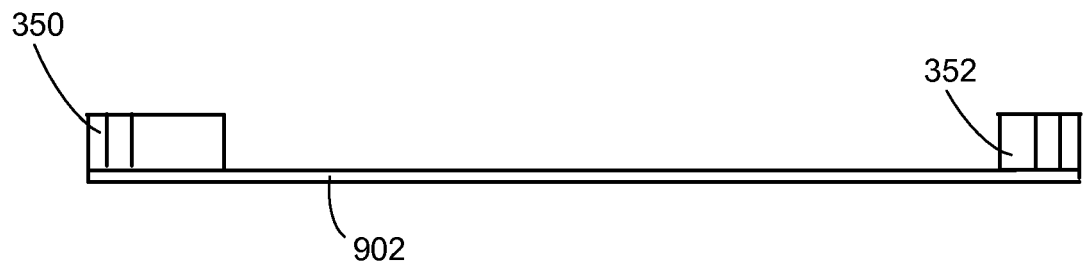
FIG. 9 is a cross-sectional view of the stackable multi-chip package system of FIG. 3 in a tape-attach phase.

Referring now to FIG. 9, therein is shown a cross-sectional view of the stackable multi-chip package system 300 of FIG. 3 in a tape-attach phase. This cross-sectional view depicts the third external interconnects 350 and the fourth external interconnects 352 on a coverlay tape 902. The third external interconnects 350 and the fourth external interconnects 352 are part of lead frame (not shown) and may be formed by a number of processes, such as deep etch or stamp.

Figure 10:
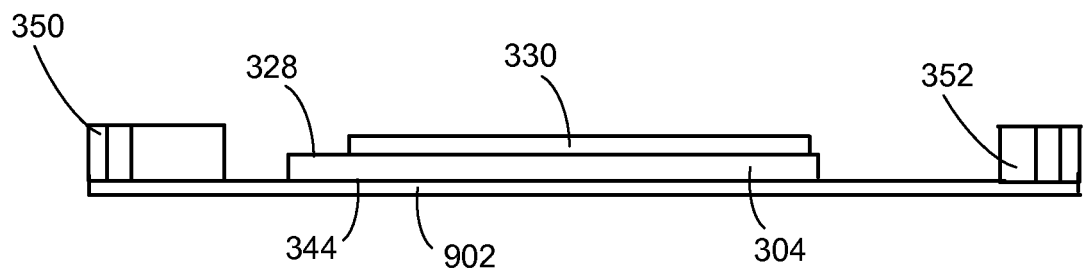
FIG. 10 is a cross-sectional view of the structure of FIG. 9 in a second die-attach phase.

Referring now to FIG. 10, therein is shown a cross-sectional view of the structure of FIG. 9 in a second die-attach phase. The second non-active side 344 of the second integrated circuit die 304 is attached to the coverlay tape 902 between the third external interconnects 350 and the fourth external interconnects 352. The inter-chip structure 330 is placed on the second active side 328.

Figure 11:
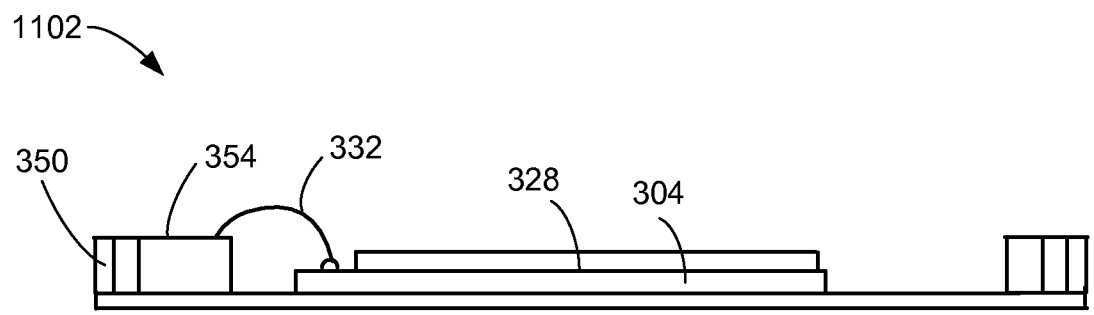
FIG. 11 is a cross-sectional view of the structure of FIG. 10 in a second interconnect-attach phase.

Referring now to FIG. 11, therein is shown a cross-sectional view of the structure of FIG. 10 in a second interconnect-attach phase. The second internal interconnects 332 connect the second active side 328 of the second integrated circuit die 304 and the second connection surfaces 354. This forms second package subassemblies 1102 in the lead frame (not shown), wherein each of the second package subassemblies 1102 has the second integrated circuit die 304 attached to the third external interconnects 350 with the second internal interconnects 332.

Figure 12:
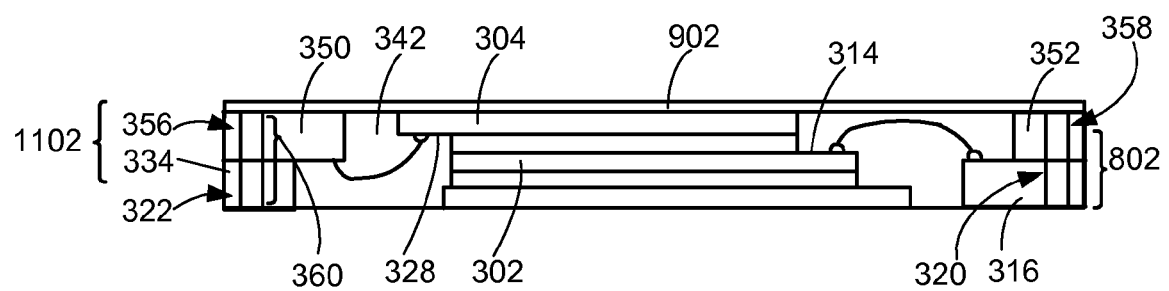
FIG. 12 is a cross-sectional view of the structure of FIG. 11 over the structure of FIG. 8 in a molding phase.

Referring now to FIG. 12, therein is shown a cross-sectional view of the structure of FIG. 1 over the structure of FIG. 8 in a molding phase. The second package subassemblies 1102 in the lead frame (not shown) attached to the coverlay tape 902 are vertically flipped and placed over the first package subassemblies 802 also in its lead frame (not shown) attached. This combined structure has the second integrated circuit die 304 over and offset the first integrated circuit die 302 with the first active side 314 facing the second active side 328. This combined structure undergoes a molding process forming the encapsulation 342.

The fourth external interconnects 352 are above the first external interconnects 316 with each having the fourth through hole 358 aligned with the first through hole 320 and forming the channel 360. The third external interconnects 350 are above the second external interconnects 334 with each having the third through hole 356 aligned with the second through hole 322 and also forming the channel 360.

Figure 13:
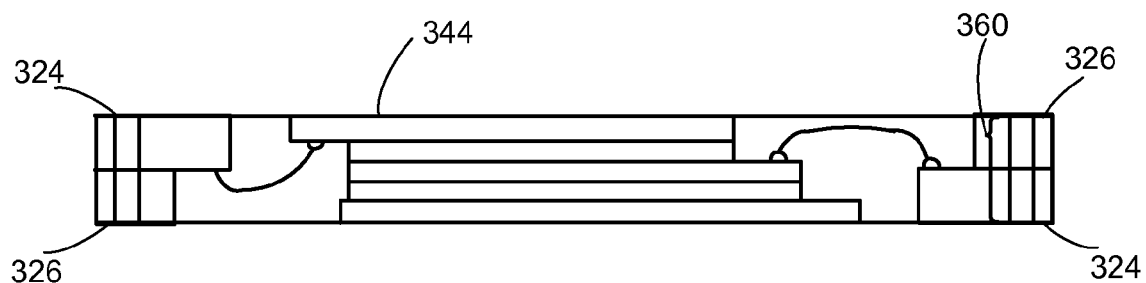
FIG. 13 is a cross-sectional view of the structure of FIG. 12 in a de-taping phase.

Referring now to FIG. 13, therein is shown a cross-sectional view of the structure of FIG. 12 in a de-taping phase. The structure of FIG. 12 undergoes a de-taping and post mold cure. The coverlay tape 902 of FIG. 9 is removed exposing the second non-active side 344, the first lands 326, and the second lands 324. The channel 360 is also exposed.

Figure 14:
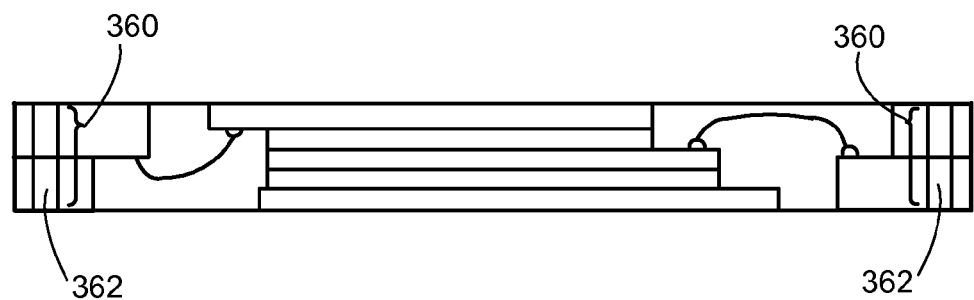
FIG. 14 is a cross-sectional view of the structure of FIG. 13 in a fill phase.

Referring now to FIG. 14, therein is shown a cross-sectional view of the structure of FIG. 13 in a fill phase. The structure of FIG. 13 may undergo an optional plating process, such as plating gold, for improved conductivity and bonding. The channel 360 is filled with the channel plug 362. The second package subassemblies 1102 in the lead frame (not shown) vertically flipped over the first package subassemblies 802 are electrically connected by the channel plug 362.

Figure 15:
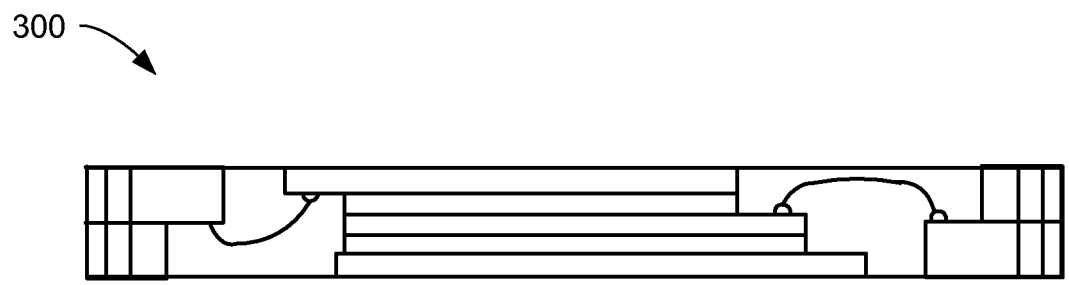
FIG. 15 is a cross-sectional view of the structure of FIG. 14 in a singulation phase.

Referring now to FIG. 15, therein is shown a cross-sectional view of the structure of FIG. 14 in a singulation phase. The structure of FIG. 14 is singulated from the lead frame (not shown) forming the stackable multi-chip package system 300.

Figure 16:
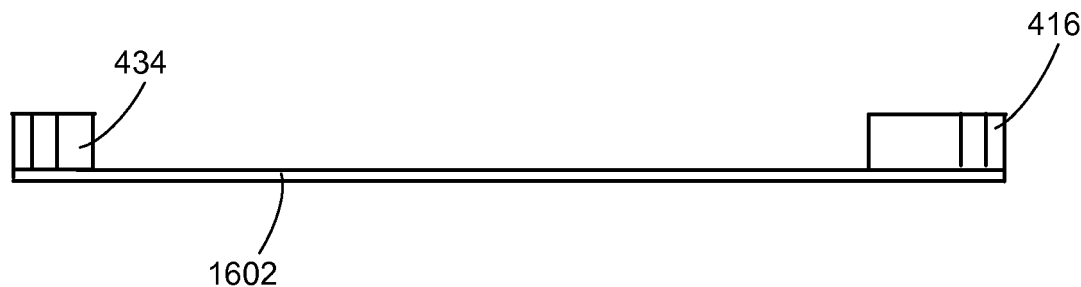
FIG. 16 is a cross-sectional view of the stackable multi-chip package system of FIG. 4 in a first tape-attach phase.

Referring now to FIG. 16, therein is shown a cross-sectional view of the stackable multi-chip package system 400 of FIG. 4 in a first tape-attach phase. This cross-sectional view depicts the first external interconnects 416 and the second external interconnects 434 on a first coverlay tape 1602. The first external interconnects 416 and the second external interconnects 434 are part of lead frame (not shown) and may be formed by a number of processes, such as deep etching of the lead frame.

Figure 17:
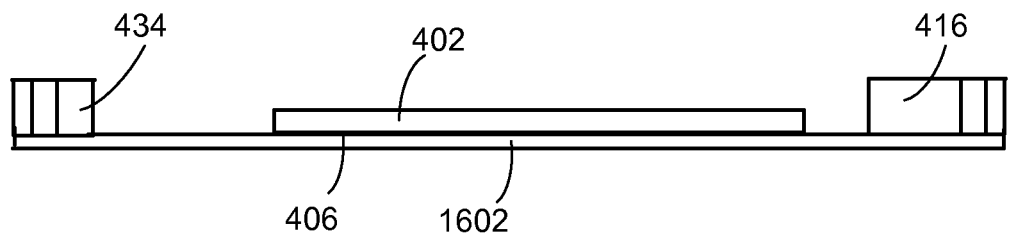
FIG. 17 is a cross-sectional view of the structure of FIG. 16 in a first die-attach phase.

Referring now to FIG. 17, therein is shown a cross-sectional view of the structure of FIG. 16 in a first die-attach phase. The first non-active side 406 of the first integrated circuit die 402 is attached on the first coverlay tape 1602 between the first external interconnects 416 and the second external interconnects 434.

Figure 18:
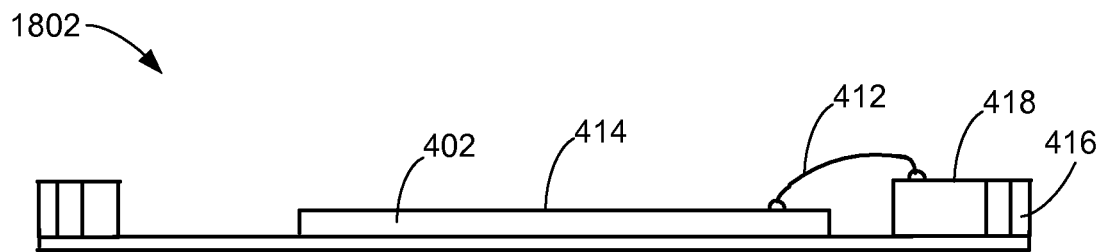
FIG. 18 is a cross-sectional view of the structure of FIG. 17 in a first interconnect-attach phase.

Referring now to FIG. 18, therein is shown a cross-sectional view of the structure of FIG. 17 in a first interconnect-attach phase. The first internal interconnects 412 connect the first active side 414 of the first integrated circuit die 402 and the first connection surfaces 418. This forms first package subassemblies 1802 in the lead frame (not shown), wherein each of the first package subassemblies 1802 has the first integrated circuit die 402 attached to the first external interconnects 416 with the first internal interconnects 412.

Figure 19:
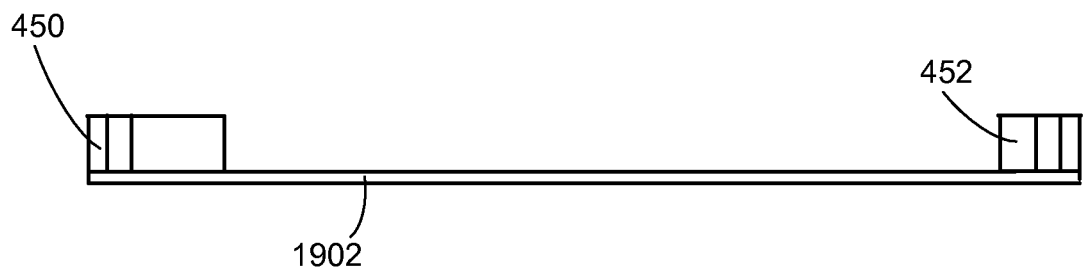
FIG. 19 is a cross-sectional view of the stackable multi-chip package system of FIG. 4 in a second tape-attach phase.

Referring now to FIG. 19, therein is shown a cross-sectional view of the stackable multi-chip package system 400 of FIG. 4 in a second tape-attach phase. This cross-sectional view depicts the third external interconnects 450 and the fourth external interconnects 452 on a second coverlay tape 1902. The third external interconnects 450 and the fourth external interconnects 452 are part of lead frame (not shown) and may be formed by a number of processes, such as deep etching of the lead frame.

Figure 20:
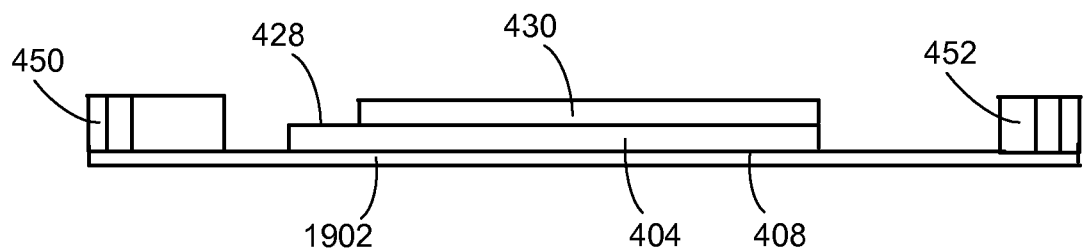
FIG. 20 is a cross-sectional view of the structure of FIG. 19 in a second die-attach phase.

Referring now to FIG. 20, therein is shown a cross-sectional view of the structure of FIG. 19 in a second die-attach phase. The second non-active side 408 of the second integrated circuit die 404 is attached on the second coverlay tape 1902 between the third external interconnects 450 and the fourth external interconnects 452. The inter-chip structure 430 is placed on the second active side 428 without impeding electrical connections.

Figure 21:
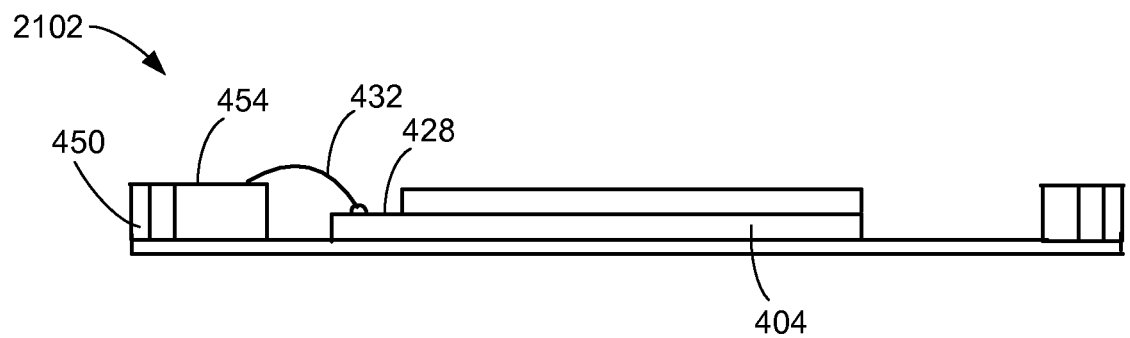
FIG. 21 is a cross-sectional view of the structure of FIG. 20 in a second interconnect-attach phase.

Referring now to FIG. 21, therein is shown a cross-sectional view of the structure of FIG. 20 in a second interconnect-attach phase. The second internal interconnects 432 connect the second active side 428 of the second integrated circuit die 404 and the second connection surfaces 454. This forms second package subassemblies 2102 in the lead frame (not shown), wherein each of the second package subassemblies 2102 has the second integrated circuit die 404 attached to the third external interconnects 450 with the second internal interconnects 432.

Figure 22:
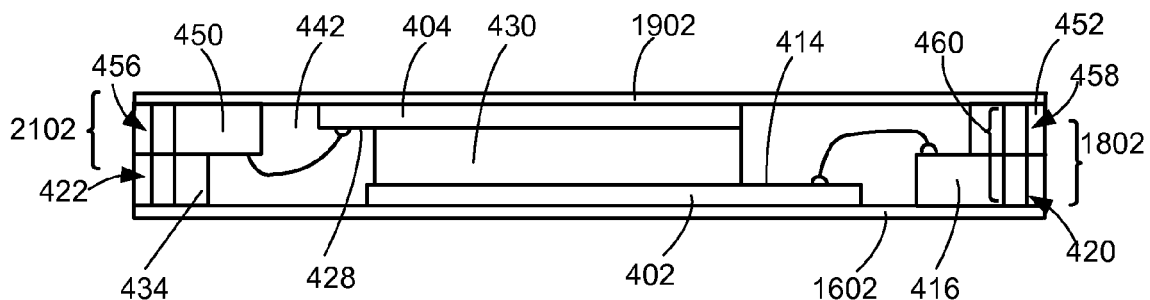
FIG. 22 is a cross-sectional view of the structure of FIG. 21 over the structure of FIG. 18 in a molding phase.

Referring now to FIG. 22, therein is shown a cross-sectional view of the structure of FIG. 21 over the structure of FIG. 18 in a molding phase. The second package subassemblies 2102 in the lead frame (not shown) attached to the second coverlay tape 1902 are vertically flipped and placed over the first package subassemblies 1802 also in its lead frame (not shown) attached to the first coverlay tape 1602. This combined structure has the second integrated circuit die 404 over and offset the first integrated circuit die 402 with the first active side 414 facing the second active side 428. The inter-chip structure 430 is between the first integrated circuit die 402 and the second integrated circuit die 404. The combined structure undergoes a molding process forming the encapsulation 442.

The third external interconnects 450 are above the second external interconnects 434 with each having the third through hole 456 aligned with the second through hole 422 and forming the channel 460. The fourth external interconnects 452 are above the first external interconnects 416 with each having the fourth through hole 458 aligned with the first through hole 420 and also forming the channel 460.

Figure 23:
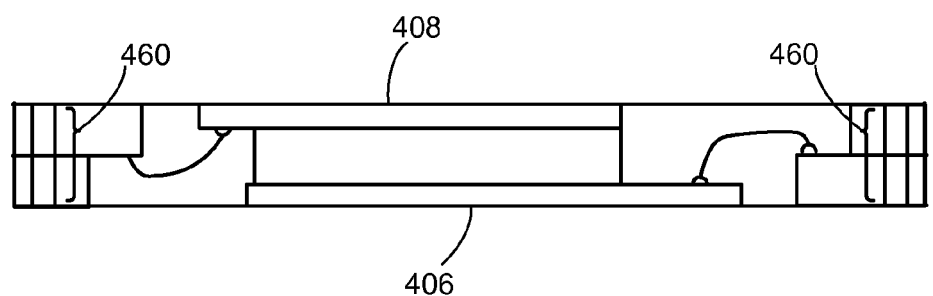
FIG. 23 is a cross-sectional view of the structure of FIG. 22 in a de-taping phase.

Referring now to FIG. 23, therein is shown a cross-sectional view of the structure of FIG. 22 in a de-taping phase. The structure of FIG. 22 undergoes a de-taping and post mold cure. The first coverlay tape 1602 of FIG. 16 and the second coverlay tape 1902 of FIG. 19 are removed exposing the first non-active side 406, the second non-active side 408, the first lands 326, and the second lands 324. The channel 460 is also exposed.

Figure 24:
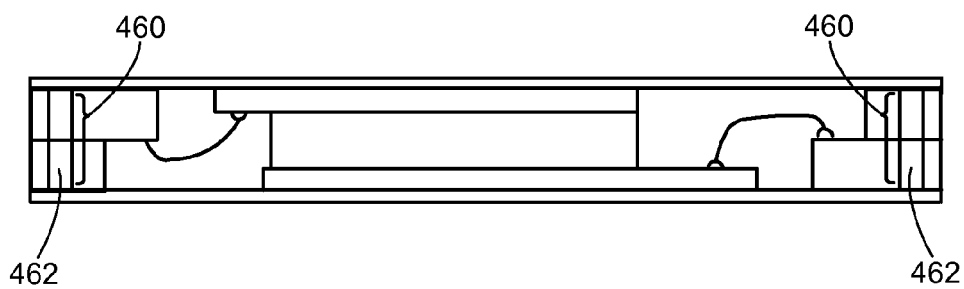
FIG. 24 is a cross-sectional view of the structure of FIG. 23 in a fill phase.

Referring now to FIG. 24, therein is shown a cross-sectional view of the structure of FIG. 23 in a fill phase. The structure of FIG. 23 may undergo an optional plating process, such as plating gold, for improved conductivity and bonding. The channel 460 is filled with the channel plug 462. The second package subassemblies 2102 in the lead frame (not shown) vertically flipped over the first package subassemblies 1802 are electrically connected by the channel plug 462.

Figure 25:
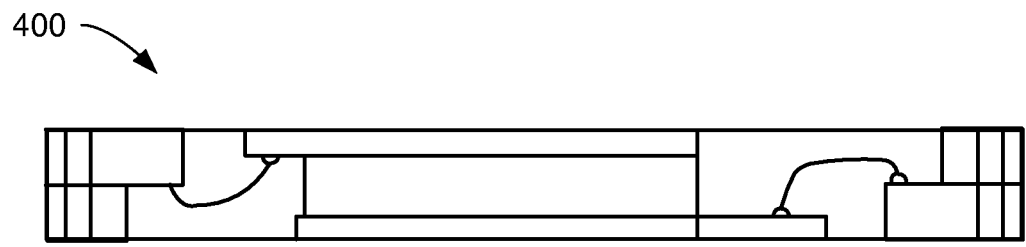
FIG. 25 is a cross-sectional view of the structure of FIG. 24 in a singulation phase.

Referring now to FIG. 25, therein is shown a cross-sectional view of the structure of FIG. 24 in a singulation phase. The structure of FIG. 24 is singulated from the lead frame (not shown) forming the stackable multi-chip package system 400.

Figure 26:
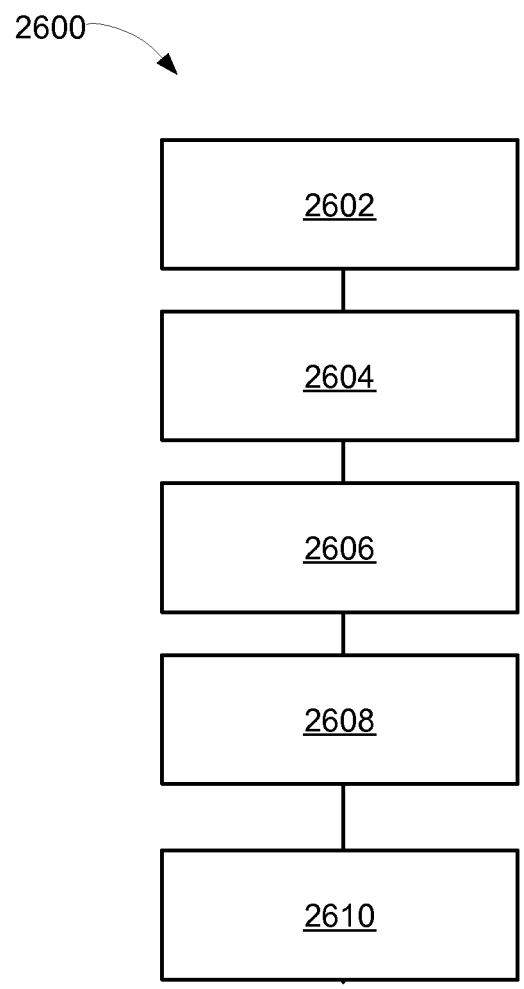
FIG. 26 is a flow chart of a stackable multi-chip package system for manufacture of the stackable multi-chip package system in an embodiment of the present invention.

Referring now to FIG. 26, therein is shown a flow chart of a stackable multi-chip package system 2600 for manufacture of the stackable multi-chip package system 300 in an embodiment of the present invention. The system 2600 includes forming a first external interconnect having a first through hole and a second external interconnect having a second through hole in a block 2602; forming a first package subassembly having the first external interconnect and a first integrated circuit die in a block 2604; forming a second package subassembly having the second external interconnect and a second integrated circuit die in a block 2606; mounting the second package subassembly over the first package subassembly in a block 2608; and molding the first package subassembly and the second package subassembly in a block 2610.

It has been discovered that the present invention thus has numerous aspects.

It has been discovered that the present invention provides stackable multi-chip package having a very low package height with enhanced thermal performance, structural rigidity to prevent warpage, high lands count, and flexibility connection options from both the top and bottom of the package.

An aspect is that the present invention provides an offset face-to-face stacking configuration of the second integrated circuit die and the first integrated circuit die for providing a low package height. The face-to-face configuration refers to an active side to active side configuration.

Another aspect of the present invention provides an offset face-to-face stacking configuration of the second integrated circuit die and the first integrated circuit die for protection of the circuitry on the active sides of the integrated circuit dice as well as providing multiple thermal dissipation paths to ambient.

Yet another aspect of the present invention provides the encapsulation with or without an inter-chip structure to fortify the planar rigidity of the package and to mitigate warpage. The inter-chip structure may serve as an EMI shield when connected to ground.

Yet another aspect of the present invention provides mold lock feature from the staggered configuration of the first and second external interconnects in the first and second rows of lands. This provides both additional structural support as well as improves performance in MSL tests.

Yet another aspect of the present invention provides the flexibility of stacking in different configurations, such as package-on-package or package-in-package configurations Yet another aspect of the present invention provides electrical connectivity on both the top and bottom of the package to accommodate different system connection requirements and stacking configurations.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the stackable multi-chip package system method of the present invention furnishes important and heretofore unknown and unavailable solutions, capabilities, and functional aspects for improving thermal performance, reducing EMI, and reliability in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A stackable multi-chip package system comprising:
    forming a first external interconnect having a first through hole and a second external interconnect having a second through hole;
    forming a first package subassembly having the first external interconnect and a first integrated circuit die with a first active side;
    forming a second package subassembly having the second external interconnect and a second integrated circuit die with a second active side;
    mounting the second package subassembly over the first package subassembly with the second integrated circuit die offset from the first integrated circuit die and the second active side facing the first active side with an inter-chip structure directly on and solely between the first active side and the second active side; and
    molding the first package subassembly and the second package subassembly.

2. The system as claimed in claim 1 wherein forming the first package subassembly includes forming a paddle in the first package subassembly with the first integrated circuit die thereon.

3. The system as claimed in claim 1 wherein mounting the second package subassembly over the first package subassembly includes attaching the first active side to the second active side with the inter-chip structure.

4. The system as claimed in claim 1 further comprising stacking a first stackable multi-chip package system below a second stackable multi-chip package system.

5. The system as claimed in claim 1 further comprising:
    mounting a first stackable multi-chip package system over a substrate;
    stacking a second stackable multi-chip package system over the first stackable multi-chip package system; and
    molding the first stackable multi-chip package system and the second stackable multi-chip package system with the substrate.

6. A stackable multi-chip package system comprising:
    forming a first external interconnect having a first through hole and a second external interconnect having a second through hole;
    forming a third external interconnect having a third through hole and a fourth external interconnect having a fourth through hole;
    forming a first package subassembly having the first external interconnect, the second external interconnect, and a first integrated circuit die with a first active side;
    forming a second package subassembly having the third external interconnect, the fourth external interconnect, and a second integrated circuit die with a second active side;
    mounting the second package subassembly over the first package subassembly with an inter-chip structure in between, the second integrated circuit die offset from the first integrated circuit die and the second active side facing the first active side and the inter-chip structure directly on and solely between the first active side and the second active side; and
    molding the first package subassembly and the second package subassembly with the first through hole, the second through hole, the third through hole, and the fourth through hole exposed.

7. The system as claimed in claim 6 wherein mounting the second package subassembly over the first package subassembly includes forming a channel with the first through hole and the fourth through hole.

8. The system as claimed in claim 6 wherein mounting the second package subassembly over the first package subassembly includes forming a channel with the second through hole and the third through hole.

9. The system as claimed in claim 6 wherein mounting the second package subassembly over the first package subassembly includes facing a second active side of the second integrated circuit die to the first active side of the first integrated circuit die.

10. The system as claimed in claim 6 further comprising filling a channel plug in the first through hole, the second through hole, the third through hole, and the fourth through hole.

11. A stackable multi-chip package system comprising:
    a first external interconnect having a first through hole;
    a second external interconnect having a second through hole;
    a first package subassembly having the first external interconnect and a first integrated circuit die with a first active side;
    a second package subassembly, having the second external interconnect and a second integrated circuit die with a second active side over the first package subassembly with the second integrated circuit die offset from the first integrated circuit die and the second active side facing the first active side;
    an inter-chip structure directly on and solely between the first active side and the second active side; and
    an encapsulation to cover the first package subassembly and the second package subassembly.

12. The system as claimed in claim 11 wherein the first package subassembly has a paddle with the first integrated circuit die thereon.

13. The system as claimed in claim 11 wherein the first active side is attached to the second active side with the inter-chip structure.

14. The system as claimed in claim 11 further comprising a first stackable multi-chip package system below a second stackable multi-chip package system.

15. The system as claimed in claim 11 further comprising:
    a first stackable multi-chip package system over a substrate;
    a second stackable multi-chip package system over the first stackable multi-chip package system; and
    a package encapsulation to cover the first stackable multi-chip package system and the second stackable multi-chip package system with the substrate.

16. The system as claimed in claim 11 wherein:
    the first external interconnect having the first through hole and the second external interconnect having the second through hole are different;
    the first package subassembly having the first integrated circuit die has the first external interconnect and the second external interconnect;
    the second package subassembly, having the second integrated circuit die and over the first package subassembly, has a third external interconnect and a fourth external interconnect;
    the encapsulation to cover the first package subassembly and the second package subassembly; and
further comprising:
    a third through hole of the third external interconnect; and
    a fourth through hole of the fourth external interconnect.

17. The system as claimed in claim 16 wherein the second package subassembly over the first package subassembly has a channel with the first through hole and the fourth through hole.

18. The system as claimed in claim 16 wherein the second package subassembly over the first package subassembly has a channel with the second through hole and the third through hole.

19. The system as claimed in claim 16 wherein the second package subassembly over the first package subassembly has a second active side of the second integrated circuit die facing the first active side of the first integrated circuit die.

20. The system as claimed in claim 16 further comprising a channel plug in the first through hole, the second through hole, the third through hole, and the fourth through hole.

* * * * *